(12) United States Patent
Saito

(10) Patent No.: US 10,184,967 B2
(45) Date of Patent: Jan. 22, 2019

(54) METHOD OF DETERMINING CAPACITANCE VALUE OF CAPACITOR WHILE TAKING APPLIED ALTERNATING VOLTAGE INTO CONSIDERATION, AND PROGRAM

(71) Applicant: MURATA MANUFACTURING CO., LTD., Kyoto-fu (JP)

(72) Inventor: Kota Saito, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 393 days.

(21) Appl. No.: 15/009,155

(22) Filed: Jan. 28, 2016

(65) Prior Publication Data

US 2016/0146871 A1 May 26, 2016

Related U.S. Application Data

(63) Continuation of application No. PCT/JP2014/065318, filed on Jun. 10, 2014.

(30) Foreign Application Priority Data

Jul. 29, 2013 (JP) .................................. 2013-156879

(51) Int. Cl.
*G01R 27/02* (2006.01)
*G01R 27/26* (2006.01)
*G06F 17/50* (2006.01)

(52) U.S. Cl.
CPC ..... *G01R 27/2605* (2013.01); *G06F 17/5036* (2013.01)

(58) Field of Classification Search
CPC .............. G01R 27/2605; G01R 31/028; G01R 31/025; G01R 15/16; G01R 27/02;
(Continued)

(56) References Cited

U.S. PATENT DOCUMENTS

2011/0279132 A1* 11/2011 Guo .................... G03F 7/70633
324/679
2012/0112771 A1* 5/2012 Schliebe ................ G01R 31/06
324/659
(Continued)

FOREIGN PATENT DOCUMENTS

JP  2002-259482 A   9/2002
JP  2012-150579 A   8/2012
(Continued)

OTHER PUBLICATIONS

International Search Report—PCT/JP2014/065318 dated Aug. 12, 2014.
Written Opinion—PCT/JP2014/065318 dated Aug. 12, 2014.

*Primary Examiner* — Jermele M Hollington
*Assistant Examiner* — Taqi Nasir
(74) *Attorney, Agent, or Firm* — Studebaker & Brackett PC

(57) ABSTRACT

The relationship between capacitance value variation and an AC voltage value of a capacitor is obtained in advance as an approximation equation or table data. The AC voltage value applied to the capacitor in the circuit is calculated. The capacitance value of the capacitor is calculated from the AC voltage value calculated in step 3 on the basis of the obtained relationship. The calculated capacitance value of the capacitor and the capacitance value of the capacitor set to the set value are compared. If the result of the comparison is that there is a difference between the two values, the calculated value is set as a new set value and the same processing is repeated. If there is no longer a difference between the two values, the capacitance value calculated at that time is determined to be the capacitance value in the circuit.

5 Claims, 4 Drawing Sheets

(58) Field of Classification Search
CPC ...... G01R 27/26; G01R 31/362; G01R 17/02; G01R 21/133
USPC ..... 324/382, 427, 519, 750.17, 754.28, 548, 324/686, 76.66, 606, 647–679, 705
See application file for complete search history.

(56) References Cited

U.S. PATENT DOCUMENTS

| | | | | |
|---|---|---|---|---|
| 2012/0139563 | A1* | 6/2012 | Teissier | G06F 3/044 324/679 |
| 2012/0153965 | A1* | 6/2012 | Huang | G01R 31/028 324/548 |
| 2012/0161788 | A1* | 6/2012 | Siewick | G01V 3/081 324/654 |
| 2013/0057297 | A1* | 3/2013 | Cheng | H02M 1/32 324/548 |
| 2013/0082720 | A1* | 4/2013 | Tang | H03J 1/005 324/677 |
| 2013/0293026 | A1* | 11/2013 | Miyamoto | H02J 50/12 307/104 |
| 2014/0091815 | A1* | 4/2014 | Suwald | G01R 27/2605 324/658 |
| 2014/0375334 | A1* | 12/2014 | Rodriguez | G01R 27/2611 324/602 |

FOREIGN PATENT DOCUMENTS

| | | |
|---|---|---|
| WO | 2012/090602 A1 | 7/2012 |
| WO | 2014/024692 A1 | 2/2014 |

\* cited by examiner

METHOD OF DETERMINING CAPACITANCE VALUE OF CAPACITOR WHILE TAKING APPLIED ALTERNATING VOLTAGE INTO CONSIDERATION, AND PROGRAM

CROSS REFERENCE TO RELATED APPLICATIONS

This application claims benefit of priority to Japanese Patent Application 2013-156879 filed Jul. 29, 2013, and to International Patent Application No. PCT/JP2014/065318 filed Jun. 10, 2014, the entire content of which is incorporated herein by reference.

TECHNICAL FIELD

The present disclosure relates to a method of determining the capacitance value of a capacitor while taking an applied alternating-current voltage into consideration in which the capacitance value of the capacitor is determined from an alternating-current voltage value applied to the capacitor in a circuit containing the capacitor, and relates to a program.

BACKGROUND

The capacitance of a capacitor changes with a DC voltage applied to the capacitor, and in an equivalent circuit model of a capacitor disclosed in International Publication No. 2012/090602, changes in the capacitance are taken into consideration by modeling the behavior of the capacitor as a current source in which the amount of current increases or decreases in accordance with the applied DC voltage. That is, in the equivalent circuit model, when a superposed voltage of an alternating-current voltage and a DC bias voltage is applied to a capacitor equivalent circuit section, a reference current generating unit refers to the alternating-current voltage and calculates a reference current. A scaling factor generating unit refers to the DC bias voltage and calculates a scaling factor with the DC bias voltage serving as a variable. A current-source current generating unit refers to the reference current and the scaling factor and calculates a current generated by the current source. The calculated current is generated by the current-source current generating unit and supplied to a basic circuit of the capacitor equivalent circuit section. Therefore, the current flowing to the capacitor equivalent circuit section corresponds to the DC bias characteristics of the actual capacitor and this equivalent circuit model indicates DC bias characteristics that are close to the actual DC bias characteristics as a result of correlating the current with the capacitance of the capacitor.

SUMMARY

Technical Problem

A high-dielectric-constant multilayer ceramic capacitor, which utilizes a barium titanate ferroelectric, is characterized in that its capacitance value greatly changes with an applied direct current (DC) or alternating current (AC) voltage. Consequently, it is necessary to estimate and appropriately take into consideration the voltage conditions when designing a circuit containing this type of capacitor. Generally, AC voltage characteristics are illustrated as a curve that indicates the change in capacitance value with respect to the change in the level of the AC voltage value, and sometimes the curve is different depending on the frequency of the AC voltage. In addition, in the case where an AC voltage and a DC voltage are simultaneously applied, the AC voltage characteristics differ depending on the level of the applied DC voltage.

However, in the method of analyzing the capacitance of a capacitor of the related art disclosed in the above-listed International Publication No. 2012/090602, only the DC voltage characteristics are taken into consideration in a state where the level and the frequency of the applied AC voltage are fixed. Consequently, there is a possibility that the capacitance of a capacitor analyzed using the capacitor equivalent circuit model disclosed in International Publication No. 2012/090602 will deviate from the capacitance under actual use conditions.

Solution to Problem

The present disclosure was made in order to solve the above-described problem and provides a method of determining a capacitance value of a capacitor while taking into consideration an applied alternating-current voltage, the method including:

a first step of obtaining in advance a relationship between capacitance value variation of a capacitor and an alternating-current voltage value applied to the capacitor when a parameter that affects alternating-current voltage characteristics of the capacitance of the capacitor, for example, a direct-current voltage value applied to the capacitor and the frequency of an alternating-current voltage applied to the capacitor, is changed;

a second step of setting a set value of the capacitance of the capacitor to an initial value;

a third step of calculating an alternating-current voltage value applied to the capacitor in a circuit containing the capacitor by using the capacitance value of the capacitor set to the set value;

a fourth step of calculating a capacitance value of the capacitor in the circuit from the alternating-current voltage value calculated in the third step on the basis of the relationship obtained in the first step; and a fifth step of comparing the calculated value of the capacitance value of the capacitor calculated in the fourth step and the set value;

where the calculated value is set as the set value and the third, fourth and fifth steps are repeated when a result of the comparison performed in the fifth step is that there is a difference between the calculated value and the set value, and the calculated value is determined to be the capacitance value of the capacitor in the circuit when the result of the comparison performed in the fifth step is that there is no difference between the calculated value and the set value.

In the method of determining a capacitance value of a capacitor of this embodiment, the capacitance value of the capacitor is calculated from the alternating-current voltage value applied to the capacitor in the circuit on the basis of the relationship between capacitance value variation of the capacitor and the applied alternating-current voltage value obtained in advance and the calculated capacitance value of the capacitor and the capacitance value of the capacitor set to a set value are compared. Then, if the result of the comparison is that there is a difference between the two values, the calculated value is set as a new set value and the same processing is repeated. If there is no longer a difference between the two values, the capacitance value calculated at that time is determined to be the capacitance value in the circuit. Here, the relationship between the capacitance value variation and the applied alternating-current voltage value of the capacitor obtained in advance is a relationship for a case where a parameter that affects the alternating-current voltage characteristics of the capacitance of the capacitor is changed. Accordingly, the capacitance value of the capacitor, which is obtained as a result of the calculated value and the set value of the capacitance value of the capacitor converging and the difference therebetween disappearing, is a value that takes into consideration a parameter that affects the alternating-current voltage characteristics of the capacitance of the capacitor. Therefore, by making the parameter that is taken into consideration be a parameter that affects the alternating-current voltage characteristics of the capacitance of the capacitor when the circuit is actually used, for example, at least a direct-current voltage value applied to the capacitor and the frequency of an alternating-current voltage applied to the capacitor, the obtained capacitance value of the capacitor comes to be an accurate value that conforms to the capacitance value under the actual use conditions. In addition, voltage and current characteristics, in each section of a circuit affected by the capacitor, can also be accurately obtained under actual use conditions.

Furthermore, the present disclosure is characterized in that, in the second step, a set value of a frequency of the alternating-current voltage applied to the capacitor is set to an initial value, and the calculated value is determined to be the capacitance value of the capacitor in the circuit at the set value of the frequency when the result of the comparison performed in the fifth step is that there is no difference between the calculated value and the set value and the third, fourth and fifth steps are repeated by changing the set value of the frequency within a fixed range.

With this method, the capacitance value of the capacitor is determined for each frequency when the frequency of the alternating-current voltage applied to the capacitor is changed over a fixed range. Consequently, the frequency characteristics of the capacitance of the capacitor can be obtained over the fixed range. Therefore, the frequency characteristics of the voltage and current in each part of the circuit affected by the capacitor can also be obtained over the fixed range.

In addition, the present disclosure provides a program for causing a computer to execute:

a first procedure in which an initial value for a set value of a capacitance of a capacitor is input and set as the set value;

a second procedure in which an alternating-current voltage value applied to the capacitor in a circuit containing the capacitor is calculated using a capacitance value of the capacitor set to the set value;

a third procedure in which a capacitance value of the capacitor in the circuit is calculated from the alternating-current voltage value calculated in the second procedure on the basis of a relationship stored in a memory between capacitance value variation of the capacitor and the alternating-current voltage value applied to the capacitor when a parameter that affects alternating-current voltage characteristics of the capacitance of the capacitor is changed;

a fourth procedure in which the calculated value of the capacitance value of the capacitor calculated in the third procedure is compared with the set value; and a fifth procedure in which the calculated value is set as the set value and the second, third and fourth procedures are repeated when the result of the comparison performed in the fourth procedure is that there is a difference between the calculated value and the set value, and in which the calculated value is determined to be the capacitance value of the capacitor in the circuit when the result of the comparison performed in the fourth procedure is that there is no difference between the calculated value and the set value.

According to this program, an accurate capacitance value of the capacitor that conforms to the actual use conditions is obtained by calculation performed using a computer. Accordingly, by using this program, a highly accurate circuit simulator can be formed for a circuit including a capacitor.

In addition, the present disclosure is characterized in that, in the first procedure of the program, an initial value for a set value of the frequency of the alternating-current voltage applied to the capacitor is input and set as the set value of the frequency, and, when there is no difference between the calculated value and the set value in the fifth procedure, the calculated value is determined to be the capacitance value of the capacitor in the circuit at the set value of the frequency, and the second, third and fourth procedures are repeated by changing the set value of the frequency within the fixed range.

With this program, accurate frequency characteristics for the capacitance value of the capacitor that conform to the actual use conditions are obtained through calculation using a computer. Therefore, by using this program, a circuit simulator can be formed that is able to analyze the frequency characteristics of a capacitor with a high degree of accuracy.

Advantageous Effects of Disclosure

According to the present disclosure, as described above, there can be provided a method of determining the capacitance value of a capacitor while taking into consideration an applied alternating-current voltage and a program, in which an accurate capacitance value of a capacitor that conforms to actual use condition is obtained.

DETAILED DESCRIPTION

Next, modes for carrying out a method of determining the capacitance value of a capacitor taking into consideration the applied alternating-current voltage and a program according to the present disclosure will be described.

Figure 1:
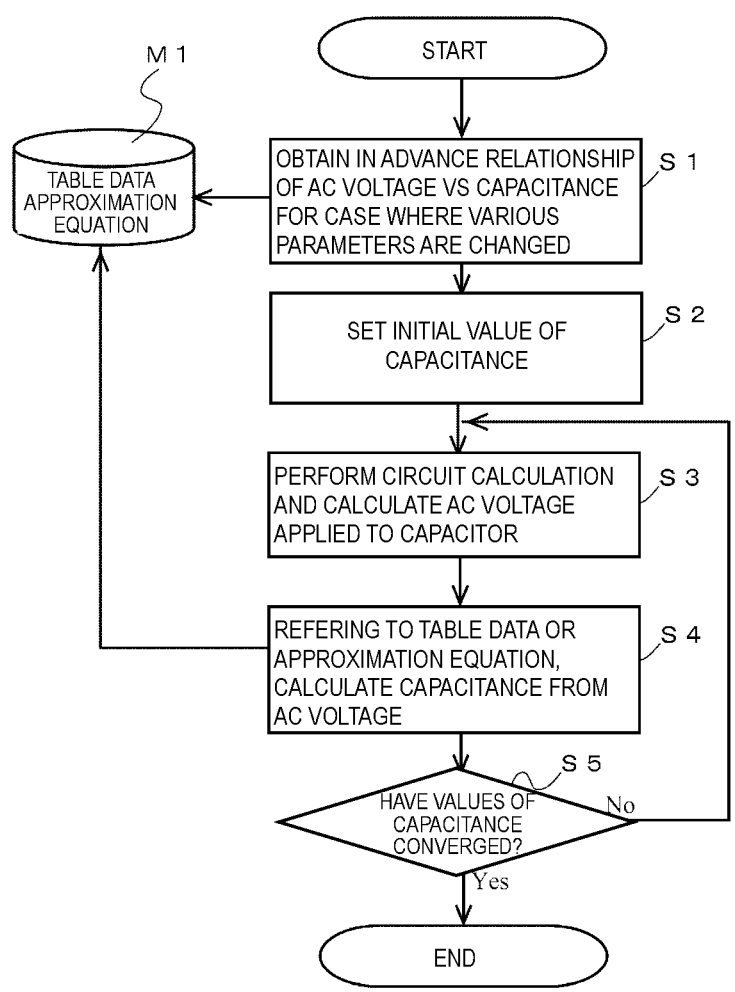
FIG. 1 is a flowchart illustrating a method of determining the capacitance value of a capacitor according to a first embodiment of the present disclosure.

FIG. 1 is a flowchart illustrating a method of determining the capacitance value of a capacitor according to a first embodiment.

In the method of determining the capacitance value of a capacitor, first, in a first step S1, the relationship between capacitance value variation of the capacitor and an AC voltage value (AC voltage level) applied to the capacitor when various parameters that affect the AC voltage characteristics of the capacitance value of the capacitor are changed is obtained in advance. In this embodiment, the DC voltage value (DC voltage level) applied to the capacitor and the frequency of the AC voltage applied to the capacitor are used as the parameters that affect the AC voltage characteristics of the capacitance of the capacitor. In addition, the relationship between the capacitance value variation of the capacitor and the AC voltage value applied to the capacitor (AC voltage value vs. capacitance) is represented by an approximation equation, which approximates the capacitance value by using the applied AC voltage value as a variable, or by table data for example and is stored in storage unit M1 such as a memory.

Here, the so-called AC voltage characteristics of the capacitance of the capacitor refers to the capacitance value variation seen when the DC voltage value applied to the capacitor and the frequency of the AC voltage applied to the capacitor are set to fixed values and then the value of the AC voltage applied to the capacitor, that is, the AC voltage level is changed. In addition, the so-called DC voltage characteristics of the capacitance of the capacitor refers to capacitance value variation seen when the AC voltage value applied to the capacitor and the frequency of the AC voltage applied to the capacitor are set to fixed values and then the value of the DC voltage applied to the capacitor, that is, the DC voltage level is changed. The AC voltage characteristics also change when the frequency of the AC voltage applied to the capacitor is changed.

Next, in a second step S2, a set value of the capacitance of the capacitor is set to an initial value. For example, a catalog value obtained under conditions of a specific DC voltage being applied to the capacitor and conditions of a specific AC voltage being applied to the capacitor is used as the initial value. Next, in a third step S3, circuit calculation is performed and an AC voltage value applied to a capacitor in a circuit containing the capacitor is calculated using the capacitance value of the capacitor set to the initial value. Next, in a fourth step, the approximation equation or table data expressing the relationship AC voltage value vs. capacitance value stored in the storage unit M1 in the first step is referred to and the capacitance value of the capacitor in the circuit is calculated from the AC voltage value calculated in the third step.

Next, in a fifth step, the calculated value of the capacitance value of the capacitor calculated in the fourth step is compared with the set value. In the case where the result of the comparison is that there is a difference between the calculated value and the set value, the capacitance values have not yet converged and a determination result of the fifth step S5 is No, the set value is updated by setting the calculated value calculated in the fourth step as the updated set value, and the third, fourth and fifth steps S3, S4 and S5 are repeated. On the other hand, in the case where the result of the comparison performed in the fifth step S5 is that there is no longer a difference between the calculated value and the set value, the capacitance values have converged and the determination result of the fifth step S5 is Yes, the calculated value of the capacitance is determined to be the capacitance value of the capacitor in the circuit.

The level of the AC voltage applied to the capacitor and the capacitance of the capacitor are parameters that interact each other. In order to acquire the capacitance of the capacitor in a circuit containing the capacitor, a solution is obtained by searching for a combination of the two parameters for which there are no inconsistencies between the parameters. Accordingly, in the method of determining the capacitance value of a capacitor of this embodiment, as described above, the capacitance value of the capacitor is calculated from the AC voltage value applied to the capacitor on the basis of the relationship between capacitance value variation of the capacitor and the AC voltage value obtained in advance as an approximation equation or table data, and the calculated capacitance value of the capacitor and the capacitance value of the capacitor set to a set value are then compared. Then, if the result of the comparison is that there is a difference between the two values, the calculated value is set as a new set value and the same processing is repeated. In the case where the values have converged and there is no longer a difference between the values, it is determined that the calculated value is one for which there are no inconsistencies in the combination of the two parameters and the capacitance value calculated at that time is determined to be the capacitance value in the circuit.

Here, the relationship between the capacitance value variation of the capacitor and the applied AC voltage value obtained in advance is a relationship for the case where parameters that affect the AC voltage characteristics of the capacitance of the capacitor, namely the applied DC voltage value and the frequency of the AC voltage in this embodiment, are changed. Accordingly, the capacitance value of the capacitor obtained by allowing the calculated value and the set value of the capacitance value of the capacitor to converge such that there is no longer a difference therebetween is a value that takes into consideration the applied DC voltage value and the frequency of the applied AC voltage value, which affect the AC voltage characteristics of the capacitor. Therefore, by making the parameters that are taken into consideration be the applied DC voltage value and the frequency of the AC voltage when the circuit is actually used, these parameters affecting the AC voltage characteristics of the capacitance of the capacitor, the obtained capacitance value of the capacitor comes to be a value that accurately conforms to the capacitance value under actual use conditions taking into consideration at least three variables, namely, the applied DC voltage value, the frequency of the AC voltage and the applied AC voltage value. In addition, voltage and current characteristics, in each section of a circuit affected by the capacitor, can also be accurately obtained under actual use conditions on the basis of the accurately obtained capacitance values.

Figure 2:
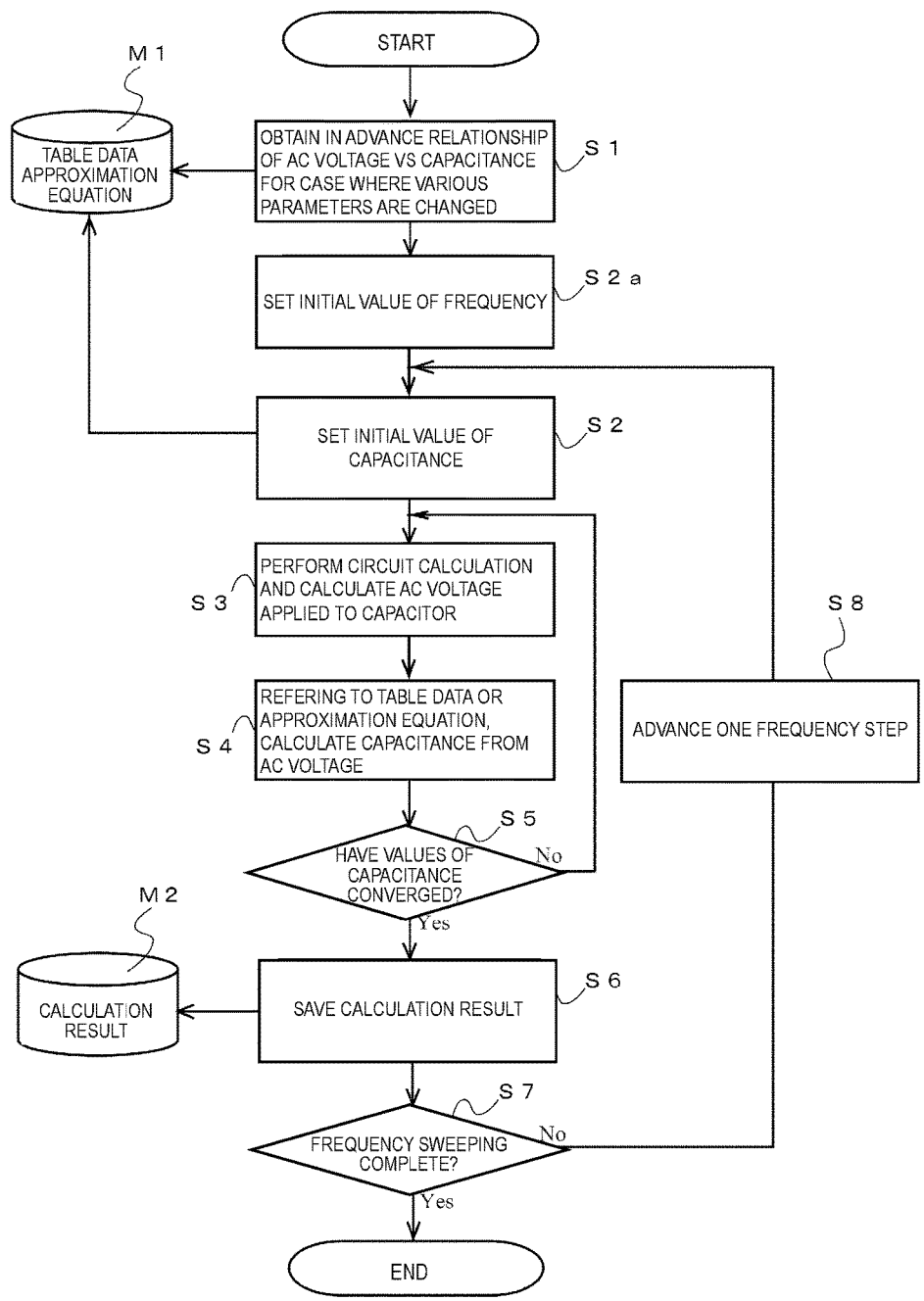
FIG. 2 is a flowchart illustrating a method of determining the capacitance value of a capacitor according to a second embodiment of the present disclosure.

FIG. 2 is a flowchart illustrating a method of determining the capacitance value of a capacitor according to a second embodiment. In this figure, processing steps and parts that are the same as in FIG. 1 are denoted by the same reference symbols and description thereof will be omitted.

In the method of determining the capacitance value of a capacitor according the second embodiment, after obtaining in advance the relationship between the capacitance value variation of a capacitor and the AC voltage value applied to the capacitor in a first step S1, a set value of the frequency of the AC voltage applied to the capacitor is set to an initial value in a second step S2a. The start value of a fixed range over which it is desired to simulate the AC voltage frequency characteristics is set as the initial value.

In addition, in the case where there is no difference between the calculated value and the set value in the fifth step S5, the capacitance values have converged and the determination result of the fifth step S5 is Yes, the calculated value calculated in the fourth step S4 is determined in a sixth step S6 as the capacitance value of the capacitor in the circuit at the frequency set to the set value of the frequency at that time. The calculation result of the calculated value is stored in a storage unit M2 such as a memory. The calculation result includes calculated voltage and current values for each part of the circuit calculated using the determined capacitance value.

Next, in a seventh step S7, it is determined whether frequency sweeping over the entire fixed range over which it is desired to simulate the AC voltage frequency characteristics is complete, that is, whether the swept frequency has reached the final value. In the case where frequency sweeping over the entire frequency range is not complete and the determination result of the seventh step S7 is No, in an eighth step S8, the set value of the frequency is increased by a certain amount to advance the frequency by one frequency step. Then, the second to seventh steps S2 to S7 are repeated. At this time, in the second step S2, the capacitance value calculated in the fourth step S4 the previous time around is set as the set value of the capacitance. Therefore, the set value of the capacitance is updated each time the second to seventh steps S2 to S7 are repeated.

Once the set value of the frequency has been changed within the fixed range, frequency sweeping over the entire fixed range over which it is desired to perform simulation is complete and the determination result of the seventh step is Yes, the processing is completed.

According to the method of determining the capacitance value of a capacitor of the second embodiment described above, the capacitance value of the capacitor and the voltage value and the current value for each part of the circuit are determined for each frequency when the frequency of an AC voltage applied to the capacitor is changed over a fixed range. Accordingly, the frequency characteristics of the capacitance of the capacitor and the frequency characteristics of the desired voltage and current in each part of the circuit affected by the capacitor can be obtained for a fixed range.

Figure 3:
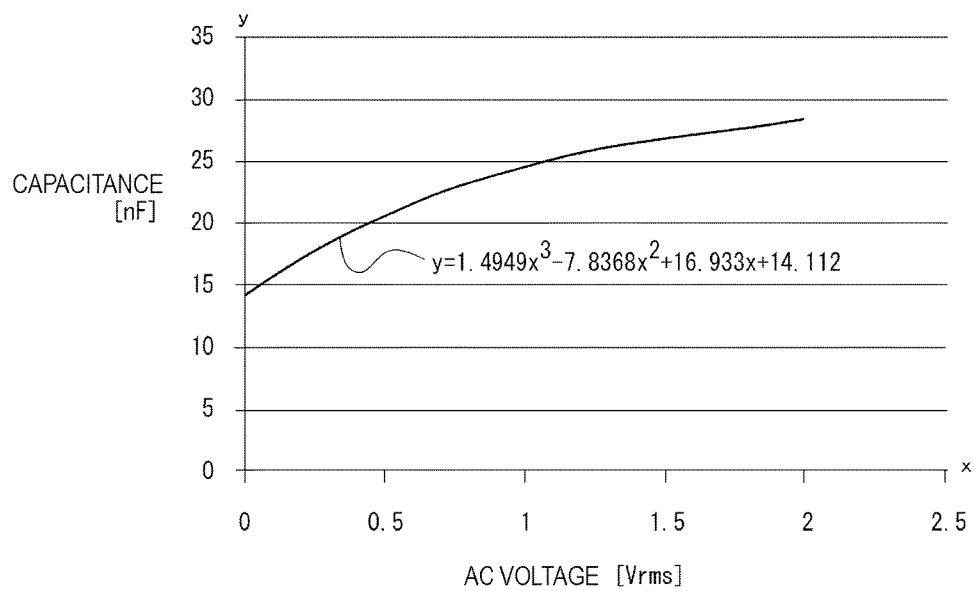
FIG. 3 is a graph illustrating a measured example of the relationship between capacitance value variation of a capacitor and the AC voltage applied to the capacitor, the relationship having been obtained in advance in each embodiment.

FIG. 3 is a graph illustrating a measured example of the relationship between the capacitance value variation of a ceramic capacitor and an AC voltage value applied to the capacitor (AC voltage value vs. capacitance) stored in the storage unit M1 in each of the above-described embodiments. The horizontal axis of the graph represents AC voltage [Vrms] and the vertical axis represents capacitance [nF]. In addition, a curve y is a measurement result illustrating the capacitance value variation of the capacitor when the AC voltage value applied to the capacitor is changed. Although the measurement is actually performed by changing parameters that affect the AC voltage characteristics of the capacitance of the capacitor, in the embodiments described above, by changing the DC voltage applied to the capacitor and the frequency of the AC voltage applied to the capacitor, here, for the sake of simplicity, measurement was performed by fixing the DC voltage applied to the capacitor to 0 [V] and the frequency of the AC voltage applied to the capacitor to 1 [MHz]. When the curve y is approximated using a cubic equation having the applied AC voltage as a variable x, the approximation equation is expressed by the following Equation (1).

$$y = 1.4949x^3 - 7.8368x^2 + 16.933x + 14.112 \quad (1)$$

Figure 4:
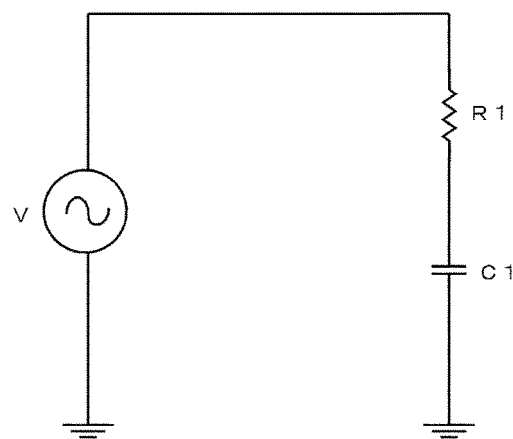
FIG. 4 illustrates an example of a simulation circuit using a capacitor for which the relationship between the capacitance value variation of the capacitor and the AC voltage applied to the capacitor is illustrated by the graph in FIG. 3.

FIG. 4 illustrates an example of a circuit using a capacitor C1 having the relationship AC voltage vs. capacitance for which the approximation equation is expressed by the above Equation (1) and a circuit simulation is performed using this circuit. As illustrated in the figure, an AC voltage source V is connected in series with a series circuit composed of the capacitor C1 and a resistor R1 in the circuit. The resistance of the resistor R1 is 50Ω and the AC voltage source V has a sine-wave-shaped output voltage waveform, an output voltage of 1 V and a frequency of 1 MHz. The approximation equation expressed by Equation (1) is set in the circuit simulator, the capacitance value of the capacitor C1 in the circuit is set to an initial value of 22 nF and a simulation is performed in accordance with the above-described flowchart.

Figure 5:
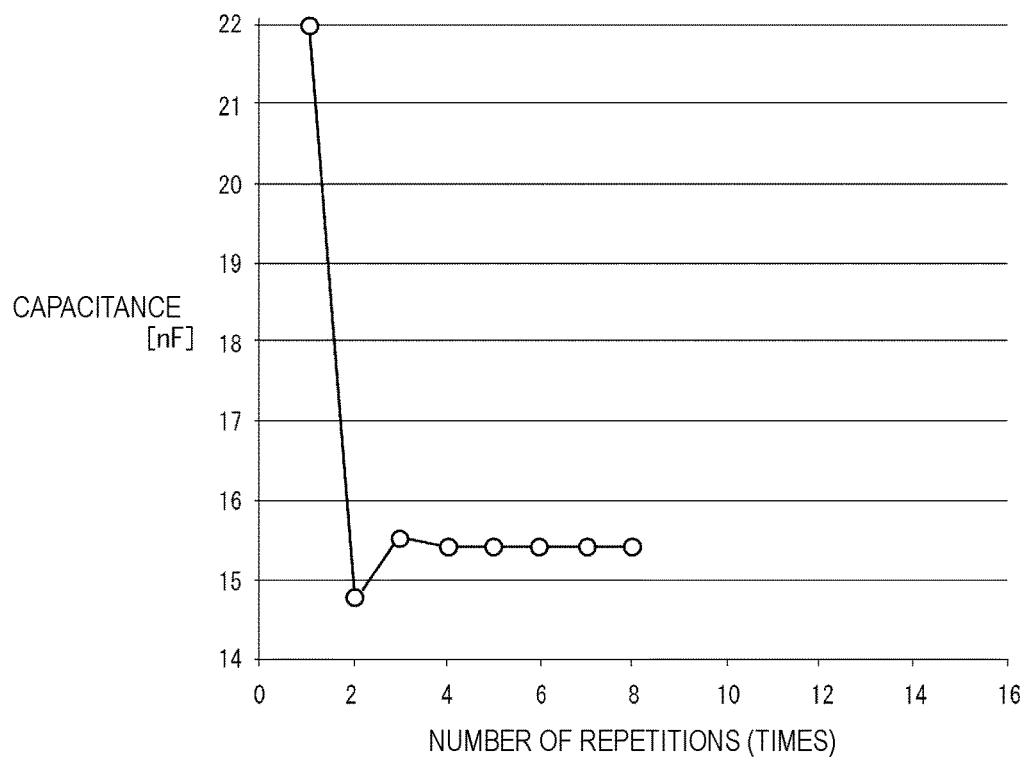
FIG. 5 is a graph illustrating the results of simulating the capacitance value of the capacitor in the circuit illustrated in FIG. 4.

FIG. 5 is a graph illustrating the results of the simulation. The horizontal axis of the graph represents the number of repetitions (times) of the third, fourth and fifth steps S3, S4 and S5 and the vertical axis represents the capacitance value nf calculated in the fourth step. In addition, the plotted round symbols represent the simulated values.

As illustrated in the graph, the capacitance value converges to 15.4 nf from a number of repetitions of 5 times onwards.

Although the results of the simulation are for a single AC voltage frequency, in the second embodiment an approximation equation is prepared for each AC voltage frequency and calculation is performed by sweeping the AC voltage frequency across a desired frequency range.

INDUSTRIAL APPLICABILITY

The method of determining the capacitance value of a capacitor according to each of the above-described embodiments can be realized and easily utilized as a computer program as follows.

That is, the method of determining the capacitance value of a capacitor according to the first embodiment can be formed as a program for causing a computer to execute a first procedure in which an initial value for a set value of the capacitance of a capacitor is input and set as the set value, a second procedure in which an AC voltage value applied to the capacitor in a circuit containing the capacitor is calculated using a capacitance value of the capacitor set to the set value, a third procedure in which a capacitance value of the capacitor in the circuit is calculated from the AC voltage value calculated in the second procedure on the basis of a relationship stored in the storage unit M1 between the capacitance value variation of the capacitor and the AC voltage value applied to the capacitor in the case where a parameter that affects the AC voltage characteristics of the capacitance of the capacitor is changed, a fourth procedure in which the calculated value of the capacitance value of the capacitor calculated in the third procedure is compared with the set value, and a fifth procedure in which the calculated value is set as the set value and the second, third and fourth procedures are repeated when the result of the comparison performed in the fourth procedure is that there is a difference between the calculated value and the set value, and in which the calculated value is determined to be the capacitance value of the capacitor in the circuit when the result of the comparison performed in the fourth procedure is that there is no difference between the calculated value and the set value.

With this program, an accurate capacitance value of the capacitor that conforms to the actual use conditions is obtained through calculation performed using a computer. Accordingly, by using this program, a highly accurate circuit simulator can be formed for a circuit including a capacitor. Here, "circuit simulator" refers to a program that calculates parameters describing physical characteristics of various passive circuit elements and active circuit elements such as the transient characteristics and frequency characteristics of the voltage and current on the basis of Ohm's Law and Kirchhoff's Laws and so forth, which are fundamental laws of electrical circuits.

In addition, the method of determining the capacitance value of a capacitor according to the second embodiment can be formed as a computer program by inputting an initial value for a set value of the frequency of the alternating-current voltage applied to the capacitor and setting the input initial value as the set value of the frequency in the first procedure of the above-described program, and, in the case where there is no difference between the calculated value and the set value in the fifth procedure, determining the calculated value to be the capacitance value of the capacitor in the circuit at the set value of the frequency and repeating the second, third and fourth procedures by changing the set value of the frequency within the fixed range.

With this program, accurate frequency characteristics for the capacitance value of the capacitor that conform to the actual use conditions are obtained through calculation using a computer. Therefore, by using this program, a circuit simulator can be formed that is able to analyze the frequency characteristics of a capacitor with a high degree of accuracy.

Furthermore, each of the above-described computer programs can be used from a terminal such as a personal computer connected to the Internet by accessing a server provided with the computer program via the Internet. In this case, a user can easily use the computer programs by accessing the server provided with the computer programs from a terminal connected to the Internet. Consequently, the methods of determining the capacitance value of a capacitor according to the above embodiments can be provided to a large number of users.

The methods of determining the capacitance value of a capacitor and the programs according to the embodiments described above have been described for a case where a DC voltage value applied to a capacitor and the frequency of an AC voltage applied to the capacitor are used as parameters that affect the AC voltage characteristics of the capacitance of the capacitor, but the parameters are not limited to those parameters. For example, aging conditions such as the temperature of the capacitor and the time period for which a voltage is applied to the capacitor may be used as the parameters and the relationship between the applied AC voltage value and the capacitance value when these parameters are changed in accordance with the conditions of the circuit actually used may be obtained in advance and stored in the storage unit M1 as table data or an approximation equation. By obtaining data on the AC voltage characteristics when the parameters are changed in this way, the capacitance of the capacitor and the current-voltage characteristics of each part of the circuit can be simulated while taking into consideration all parameters.

The invention claimed is:

1. A method of determining a capacitance value of a capacitor while taking into consideration an alternating-current voltage, the method comprising:
   a first step of obtaining in advance a relationship between capacitance value variation of a capacitor and an alternating-current voltage value applied to the capacitor when a parameter that affects alternating-current voltage characteristics of the capacitance of the capacitor is changed;
   a second step of setting a set value of the capacitance of the capacitor to an initial value;
   a third step of calculating an alternating-current voltage value applied to the capacitor in a circuit containing the capacitor by using the capacitance value of the capacitor set to the set value;
   a fourth step of calculating a capacitance value of the capacitor in the circuit from the alternating-current voltage value calculated in the third step on the basis of the relationship obtained in the first step; and
   a fifth step of comparing the calculated value of the capacitance value of the capacitor calculated in the fourth step and the set value;
   wherein the calculated value is set as the set value and the third, fourth and fifth steps are repeated when a result of the comparison performed in the fifth step is that there is a difference between the calculated value and the set value, and the calculated value is determined to be the capacitance value of the capacitor in the circuit when the result of the comparison performed in the fifth step is that there is no difference between the calculated value and the set value.

2. The method of determining a capacitance value of a capacitor while taking into consideration an alternating-current voltage according to claim 1,
   wherein, in the second step, a set value of a frequency of the alternating-current voltage applied to the capacitor is set to an initial value, and
   the calculated value is determined to be the capacitance value of the capacitor in the circuit at the set value of the frequency when the result of the comparison performed in the fifth step is that there is no difference between the calculated value and the set value and the third, fourth and fifth steps are repeated by changing the set value of the frequency within a fixed range.

3. A computer program product, comprising:
   a non-transitory computer-readable storage medium that includes a program for causing a computer to execute:
   a first procedure in which an initial value for a set value of a capacitance of a capacitor is input and set as the set value;
   a second procedure in which an alternating-current voltage value applied to the capacitor in a circuit containing the capacitor is calculated using a capacitance value of the capacitor set to the set value;
   a third procedure in which a capacitance value of the capacitor in the circuit is calculated from the alternating-current voltage value calculated in the second procedure on the basis of a relationship stored in a memory between capacitance value variation of the capacitor and the alternating-current voltage value applied to the capacitor when a parameter that affects alternating-current voltage characteristics of the capacitance of the capacitor is changed;
   a fourth procedure in which the calculated value of the capacitance value of the capacitor calculated in the third procedure is compared with the set value; and
   a fifth procedure in which the calculated value is set as the set value and the second, third and fourth procedures are repeated when the result of the comparison performed in the fourth procedure is that there is a difference between the calculated value and the set value, and in which the calculated value is determined to be the capacitance value of the capacitor in the circuit when the result of the comparison performed in the fourth procedure is that there is no difference between the calculated value and the set value.

4. The computer program product according to claim 3, wherein, in the first procedure, an initial value for a set value of the frequency of the alternating-current voltage applied to the capacitor is input and set as the set value of the frequency, and the calculated value is determined to be the capacitance value of the capacitor in the circuit at the set value of the frequency when there is no difference between the calculated value and the set value in the fifth procedure, and the third, fourth and fifth procedures are repeated by changing the set value of the frequency within a fixed range.

5. The method of determining a capacitance value of a capacitor while taking an alternating-current voltage into consideration according to claim 1, wherein the parameter includes at least a direct-current voltage value applied to the capacitor and a frequency of an alternating-current voltage applied to the capacitor.

\* \* \* \* \*